(12) United States Patent
Yi

(10) Patent No.: US 6,802,118 B1
(45) Date of Patent: Oct. 12, 2004

(54) METHOD FOR SURFACE MOUNTING ELECTRONIC COMPONENTS ON A PRINTED CIRCUIT BOARD

(75) Inventor: Yun Hyung Yi, Kyungki-do (KR)

(73) Assignee: Mirae Corporation, Choongchungnam-do (KR)

( * ) Notice: Subject to any disclaimer, the term of this patent is extended or adjusted under 35 U.S.C. 154(b) by 302 days.

(21) Appl. No.: 09/586,797

(22) Filed: Jun. 5, 2000

(30) Foreign Application Priority Data

Sep. 1, 1999 (KR) ........................................ 1999-36866

(51) Int. Cl.[7] .............................. H05K 3/30; B65H 1/00
(52) U.S. Cl. ............................ 29/832; 29/740; 29/743; 29/593; 29/833; 414/806
(58) Field of Search ........................ 29/832, 740, 743, 29/593, 833; 198/358, 349, 370.01; 414/806

(56) References Cited

U.S. PATENT DOCUMENTS

| | | | | |
|---|---|---|---|---|
| 4,624,050 A | * | 11/1986 | Hawkswell | 29/26 A |
| 4,631,812 A | * | 12/1986 | Young | 198/586 |
| 4,914,808 A | * | 4/1990 | Okumura et al. | 29/740 |
| 5,084,962 A | * | 2/1992 | Takahashi et al. | 29/833 |
| 5,323,528 A | * | 6/1994 | Baker | 29/721 |
| 5,491,888 A | * | 2/1996 | Sakurai et al. | 29/740 |
| 5,495,661 A | * | 3/1996 | Gromer et al. | 29/740 |
| 5,855,059 A | * | 1/1999 | Togami et al. | 29/740 |
| 5,979,045 A | * | 11/1999 | Nishimori et al. | 29/740 |
| 6,000,123 A | * | 12/1999 | Munezane et al. | 29/721 |

\* cited by examiner

Primary Examiner—Carl J. Arbes
Assistant Examiner—Tai Nguyen
(74) Attorney, Agent, or Firm—Fleshner & Kim, LLP

(57) ABSTRACT

A method of mounting electrical components on a printed circuit board includes moving the printed circuit board to a first mounting location, picking up a plurality of electrical components with a corresponding plurality of mounter heads, and then placing the electrical components onto the printed circuit board with the mounter heads. The mounter heads are arranged so that they can move with respect to each other in both the X and Y directions, which allows the mounting device to mount a plurality of electrical components onto the printed circuit board substantially simultaneously, thereby reducing the amount of time required to produce a finished PCB. In some embodiments of the invention, the printed circuit board may be moved from a first position at which a first mounting head mounts electrical components onto the printed circuit board to a second mounting position at which a second mounting head mounts electrical components on the printed circuit board. The first and second mounting positions may be located along the same conveyer, or on respective first and second conveyors, with the printed circuit board being moved back and forth between the conveyors.

14 Claims, 7 Drawing Sheets

METHOD FOR SURFACE MOUNTING ELECTRONIC COMPONENTS ON A PRINTED CIRCUIT BOARD

BACKGROUND OF THE INVENTION

1. Field of the Invention

The present invention relates to a surface mounting apparatus, and more particularly to a surface mounting apparatus and a surface mounting method capable of holding a plurality of components at a time by head units coupled to a plurality of Y-frames and then mounting the same on a printed circuit board.

2. Description of the Conventional Art

A conventional surface mounting apparatus is structured to recognize the patterns of the electronic components by the image processing to determine the positioning of the components and then to mount the components at the positions determined on a printed circuit board (PCB).

As the above-described apparatus, there is known a surface mounting apparatus as shown in FIG. 1. As shown in FIG. 1, the surface mounting apparatus 1 consists of an XY frame 2, a head unit 3 supported to be moved in the X and Y directions by the XY frame 2, a component feeder 4 for supplying the electronic components 8, a position determining unit 5, and a conveyer 7 carrying the PCB 6. Further, the XY frame 2 consists of an X frame 2b and Y frames 2a.

In case the electronic components 8 are mounted on the PCB 6 being carried by the conveyer 7, the operation of the surface mounting apparatus thus constructed is as follows. Namely, when the XY frame 2 is driven by a driving means (not shown), the head unit 3 is moved to a position on a predetermined piece of electronic component 8 placed on the component feeder 4. A suction means connected to a suction nozzle 3a of the head unit 3 is then operated, so that the suction nozzle 3a vacuum sucks the electronic component 8 to hold it. The suction nozzle 3a is adapted to hold and support the electronic component 8 in the mounting direction of the component 8 on the PCB 6.

The XY frame 2 is driven by a driving means (not shown) to be moved to a position on the position determining unit 5. There are disposed the electronic components 8 within a view field of an image capturing means at the mounting direction described above.

The head unit 3 is moved to a position determined by the position determining unit 5 over the PCB 6 which is transferred to the mounting position by the conveyer 7. Thus, the electronic component 8 held by the suction nozzle 3a of the head unit 3 is mounted on the PCB 6. It is noted that the suction nozzle 3a of the head unit 3 releases the vacuum sucked electronic component 8 when the suction means becomes inactivated. By such an operation, a piece of electronic component 8 can be mounted on the PCB 6.

In order for the electronic component sucked by the nozzle to be placed on the PCB, although a plurality of suction nozzles installed at the XY frame are provided, the conventional surface mounting apparatus having the above-mentioned structure places individually one by one the sucked components on the PCB, through the movement of the XY frame.

In consequence, since the prior art performs the placing of the electronic components on the PCB one by one, the mounting speed is reduced, thus resulting in the reduction of productivity. In case of a large size of the XY frame, this type of XY frame cannot meet both the component mounting speed and the accuracy thereof.

SUMMARY OF THE INVENTION

Therefore, an object of the present invention is to provide a surface mounting apparatus and a surface mounting method, by which electronic components are accurately mounted on a printed circuit board adapted to be freely moved within a work area, by using a plurality of Y-frames each being formed in a stripe shape and which are movable in a predetermined direction.

Another object of the present invention is to provide a surface mounting apparatus and a surface mounting method which enables simultaneously picking up and placing a plurality of electronic components on a printed circuit board within respective work areas.

To accomplish the above objects according to the present invention, there is provided a surface mounting apparatus comprising: a pair of fixed frames; another frames which correspond to said pair, the number of said another frames including at least more than one compared with that of said fixed frames. Moreover, the surface mounting apparatus according to the present invention comprises: a moving member movable freely in a predetermined direction, and on which a printed circuit board is seated; a plurality of fixed X-frames; a plurality pairs of Y-frames installed with respect to the X-frames, each of Y-frames being formed in a stripe shape; head units installed at predetermined places of the Y-frames; and a plurality of vision units installed at predetermined places with a predetermined spacing between the X-frame and the vision unit.

According to another aspect of the present invention, there is also provided a method for surface mounting electronic components on PCB, the method comprising the steps of: providing the PCB from a conveyer to a moving member; moving the PCB to predetermined place; head units holding electronic components; identifying if the head units accurately hold the electronic components; holding the electronic components again, if the electronic components are not held accurately; mounting the electronic components on the PCB, if the electronic components are held accurately; confirming whether or not predefined movement routes are completed; and discharging the PCB, if the predefined movement routes are completed.

According to still another aspect of the present invention, there is provided a surface mounting apparatus comprising: at least one or more conveyers for carrying a PCB; a PCB distribution unit for distributing the PCB carried from the conveyers to predetermined places; a plurality of fixed X-frames; a plurality of Y-frame pairs installed with respect to the X-frames, each Y-frame being formed in a stripe shape; a head unit installed at predetermined place of the Y-frame; a PCB recovery unit for recovering the PCB; a plurality of vision units installed at predetermined places, spaced apart at a predetermined spacing therebetween; and at least one or more feeders for supplying the electronic components. The surface mounting method according to the present invention comprises the steps of: providing the PCB from a first conveyer to a moving member; transferring the PCB from the first conveyer to the second conveyer using a PCB distribution unit; respective head units holding respective electronic components from first and second component feeders; identifying if each of the head units accurately holds the electronic component; holding the electronic components again, if the electronic components are not held accurately; and mounting the electronic components on the PCB, if the electronic components are held accurately; moving the PCB by a determined distance; confirming if a predefined movement route has been completed; moving the PCB from the second conveyer to the first conveyer using a PCB recovery unit; discharging the PCB so that the PCB transferred from the second conveyer dose not interfere with another PCB transferred from the first conveyer.

According to the present invention, the surface mounting apparatus is advantageously provided in which a plurality of Y-frames each being formed in a strip shape, are provided to hold lots of components at a time, and after confirming them by the vision unit, the plural components are mounted on the PCB. The surface mounting of plural components at a time reduces overall operation time, thus resulting in an improvement of overall productivity. Further, an advantage is also provided in that difference between the productivity estimated at optimal conditions and the practical productivity can be significantly reduced.

DETAILED DESCRIPTION OF THE INVENTION

The details of the preferred embodiment in accordance with the present invention will be described below, with reference to the accompanying drawings.

Figure 1:
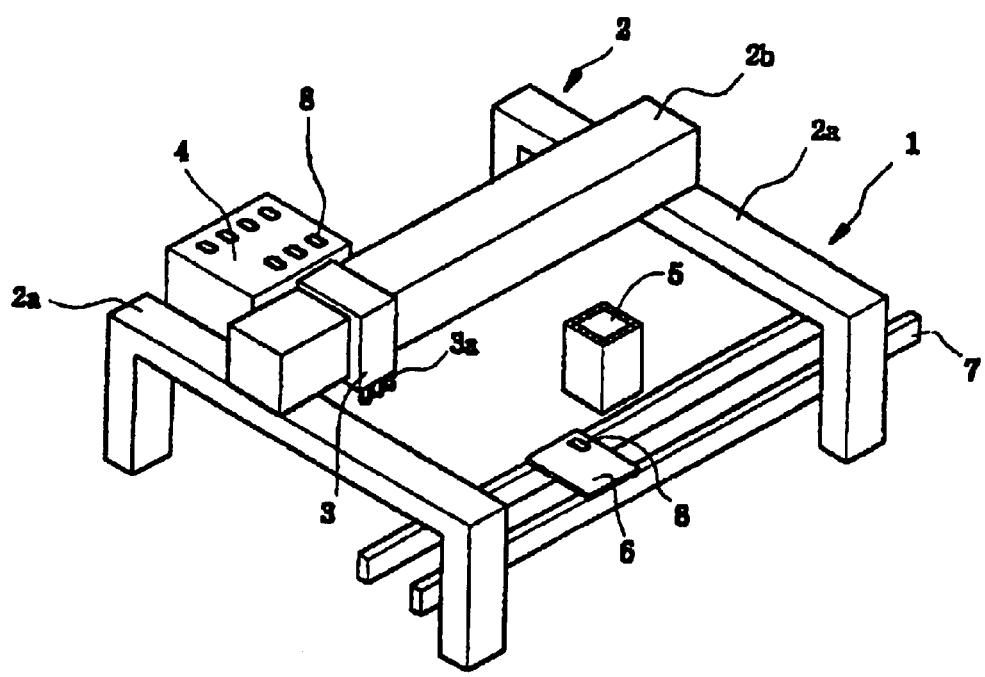
FIG. 1 shows a schematical perspective view of a conventional surface mounting apparatus.
Figure 2:
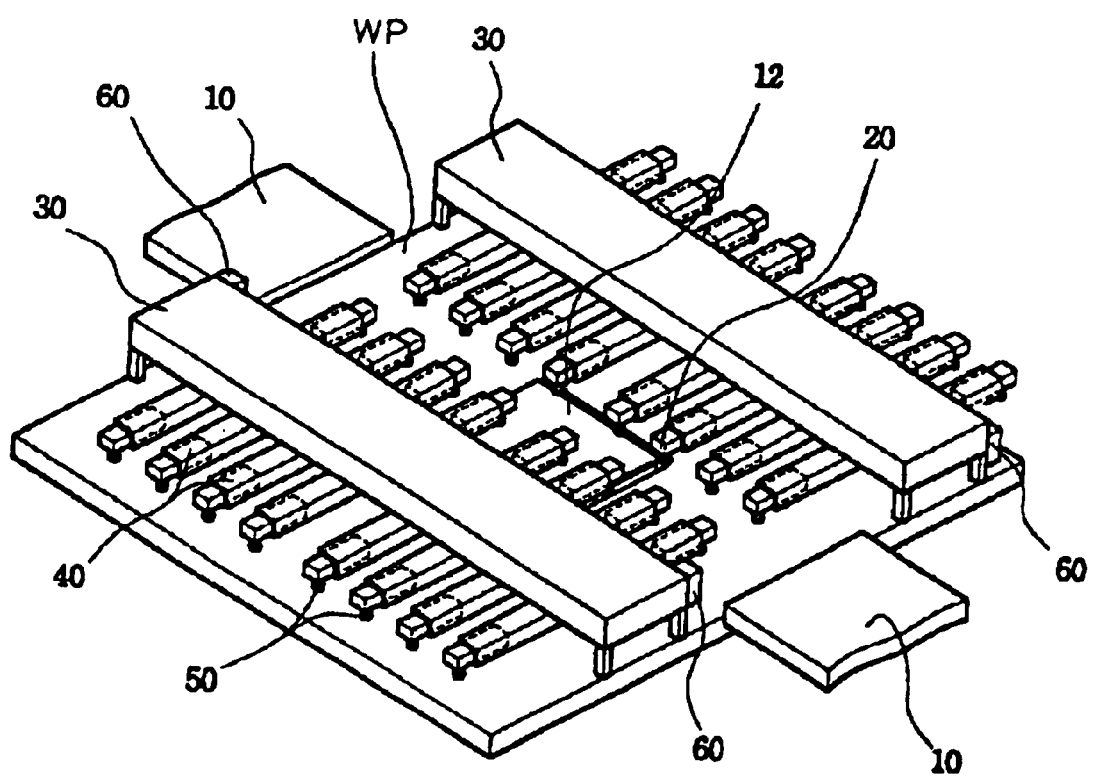
FIG. 2 shows a schematical perspective view of a surface mounting apparatus according to the present invention.
Figure 3:
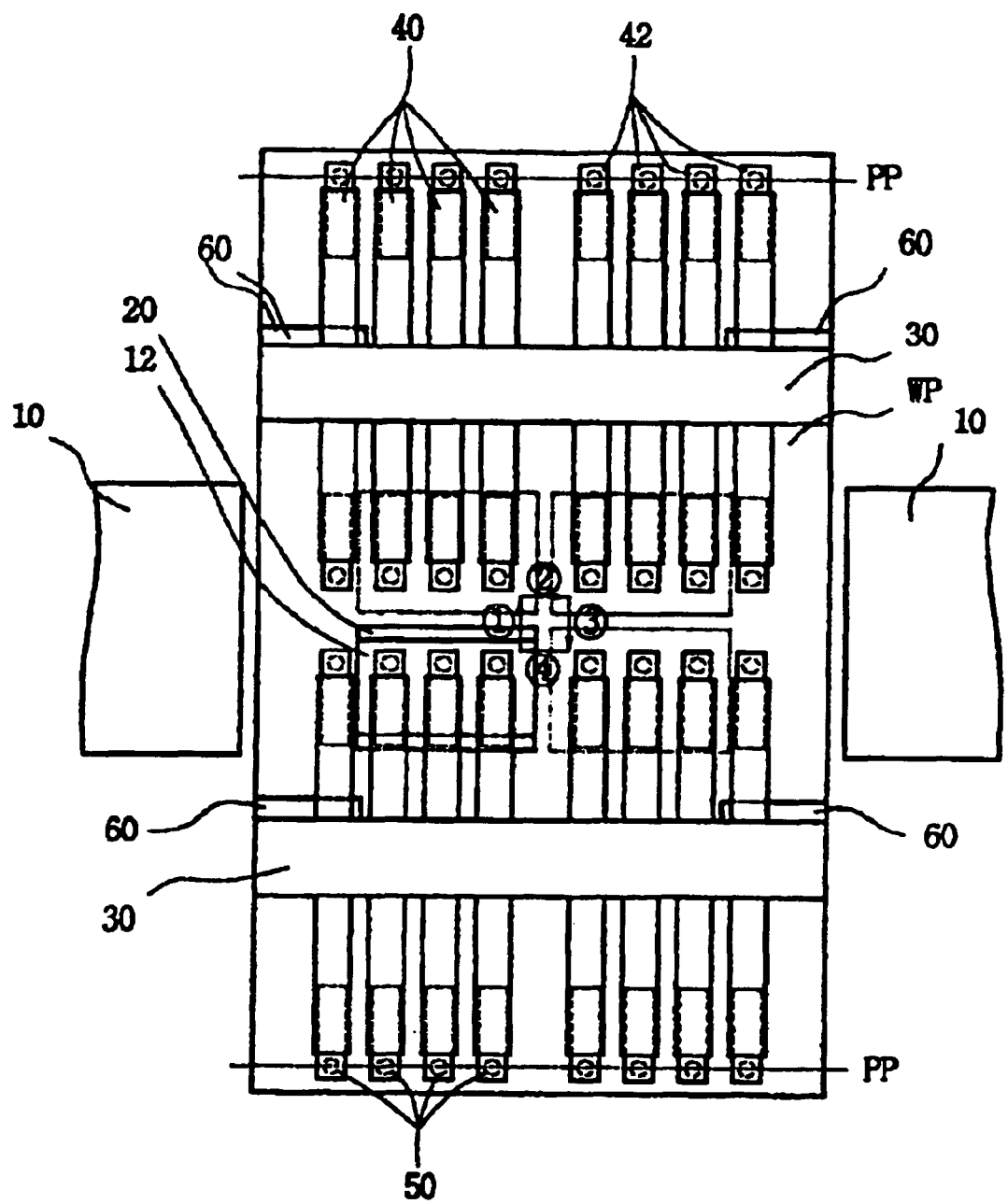
FIG. 3 is a plan view of the surface mounting apparatus shown in FIG. 2.
Figure 4:
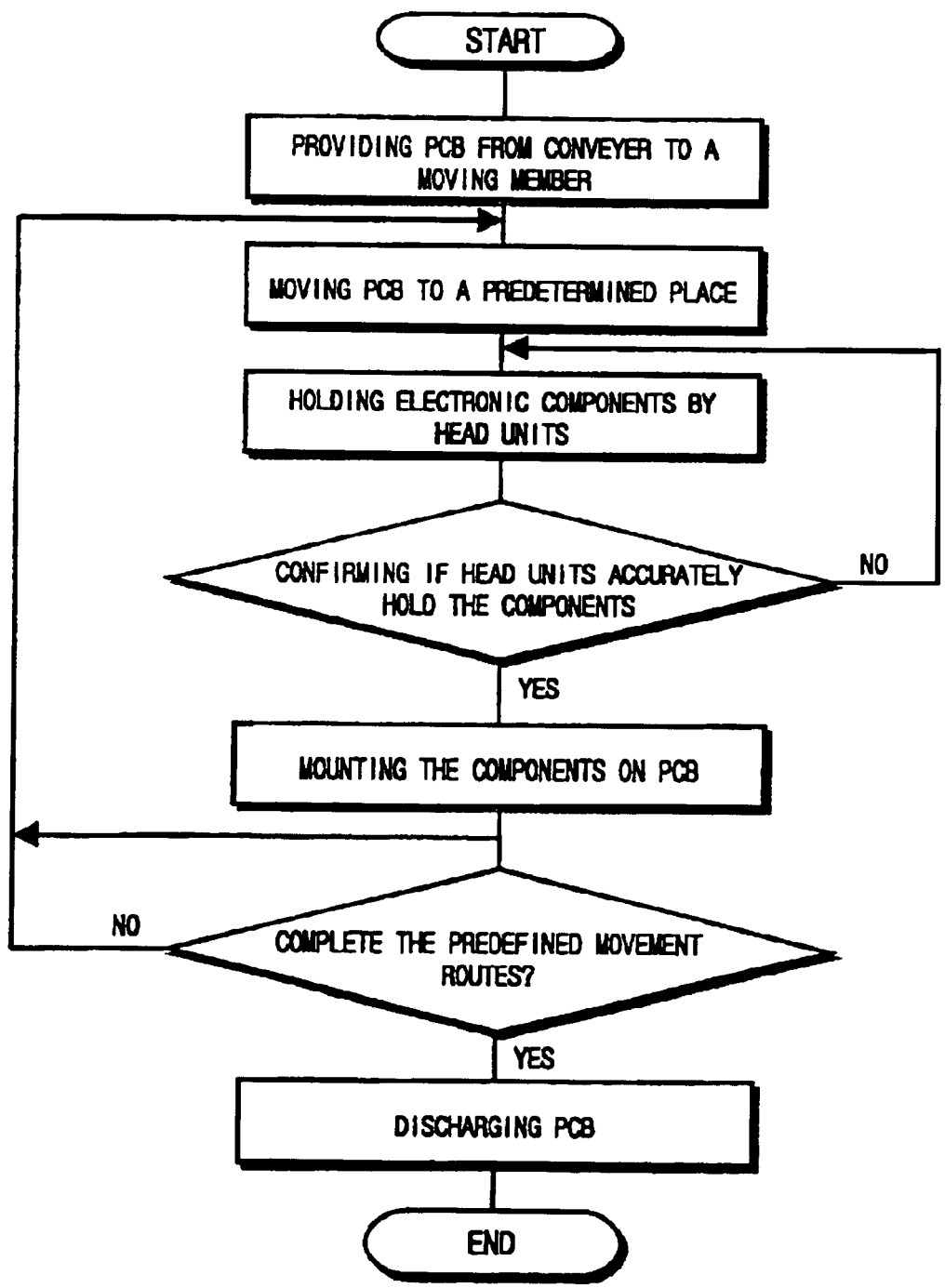
FIG. 4 is a flow chart explaining a method for surface mounting by using the surface mounting apparatus according to the present invention.

FIG. 2 schematically shows perspective view of a surface mounting apparatus according to the present invention, FIG. 3 is a plan view of the surface mounting apparatus shown in FIG. 2, and FIG. 4 is a flow chart explaining a method for surface mounting by using the surface mounting apparatus according to the present invention.

As shown in FIGS. 2 and 3, the surface mounting apparatus according to the present invention includes a moving member 20 on which a PCB 12 carried by a conveyer 10 is seated. Further, the moving member 20 is adapted to be freely moved in a predetermined direction within a work area WP. That is, the moving member 20 acts like a small gantry movable in the predetermined direction, which may be implemented by, for example, a linear motor, a surface motor, or the like. Moreover, the surface mounting apparatus according to the present invention has a pair of X-frames 30 fixedly installed at a predetermined spacing. In relation to the X-frames 30, there are provided a plurality of Y-frames 40, each being formed in a stripe shape. It is noted that the reverse installation of X-frame 30 and Y-frames 40 may be also possible.

A head unit 50 is installed at a predetermined place of the Y-frame 40, and can be moved along a longitudinal direction of the Y-frame 40. It is preferable to install one head unit, but in some cases, a plurality of head units may be provided. Further, a plurality of Y-frames 40 can be moved by predetermined distances along a longitudinal direction of X-frame 30. As shown in FIG. 3, the Y-frame 40 may be designed in such a manner that a width thereof becomes gradually narrower towards a lower end portion 42 of the Y-frame 40 and a length thereof can be adjusted, in order to prevent an overlapping of two adjacent head units. Further, if the Y-frame 40 is to be configured only in a stripe shape, the overlapping can be avoided by the head unit 50 installed to slightly project from one side of the stripe. A plurality of vision units 60 are installed to be spaced apart from the X-frame 30. The vision units 60 are used to identify whether each of the head units 50 properly holds the electronic component or not, as well as an aligning status of the electronic components. The vision units 60 can be implemented by a charge coupled device (CCD) in accordance with the present embodiment.

In the meantime, the PCB 12 carried by the conveyer 10 can be freely moved within the work area WP. Further, the moving member 20 which the PCB 12 is seated thereon is moved through the predefined movement route within the work area WP, for example, in a direction of the arrow in FIG. 3. The movement route is to be previously defined by the user, and can thus be varied by the user as necessary.

In FIG. 3, two-dotted chain lines longitudinally drawn at both upper and lower ends of the work area WP, respectively, denote picking positions PP at which the electronic components are picked up.

The operation of the surface mounting apparatus will be described.

At first, the PCB 12 carried by the conveyer 10 is seated on the moving member 20. The moving member 20 carrying the PCB 12, which can be moved in predetermined direction, is then moved in a direction set by the user. For example, assuming that left lower point is taken as reference point in FIG. 3, if the PCB 12 is moved toward the left lower point, the head units 50 coupled to a plurality of Y-frames 40 hold the electronic components, and the components are then mounted on the PCB 12 after a vision unit 60 identified the electronic components. As the PCB 12 moves in a direction, 1→2→3→4, indicated by the arrow in FIG. 3, the head units 50 coupled to the Y-frames 40 also move correspondingly thereto, thereby sequentially mounting the electronic components on the PCB 12 after being identified by the vision units 60.

Since the dimension of the Y-frame 40 can be adjusted in consideration of the dimension of the PCB 12 and moving speed thereof, further for the purpose of avoiding the overlapping between heads 50, the Y-frame 40 facilitates the mounting operations. It is noted that although the Y-frames 40 are arranged in one or two columns as in FIG. 3, the plural columns of the Y-frames may be arranged.

Next, the present invention also provides a method for surface mounting electronic components on a printed circuit board, the method comprising the steps of: providing the PCB 12 from a conveyer 10 to a moving member 20; moving the PCB to predetermined place; head units 50 holding electronic components; identifying if the head units 50 hold the electronic components; holding the electronic components again, if the electronic components are not held accurately, and mounting the electronic components on the PCB, if the electronic components are held accurately; confirming whether or not predefined movement routes are completed; and discharging the PCB 12, if the predefined movement routes are completed.

Figure 5:
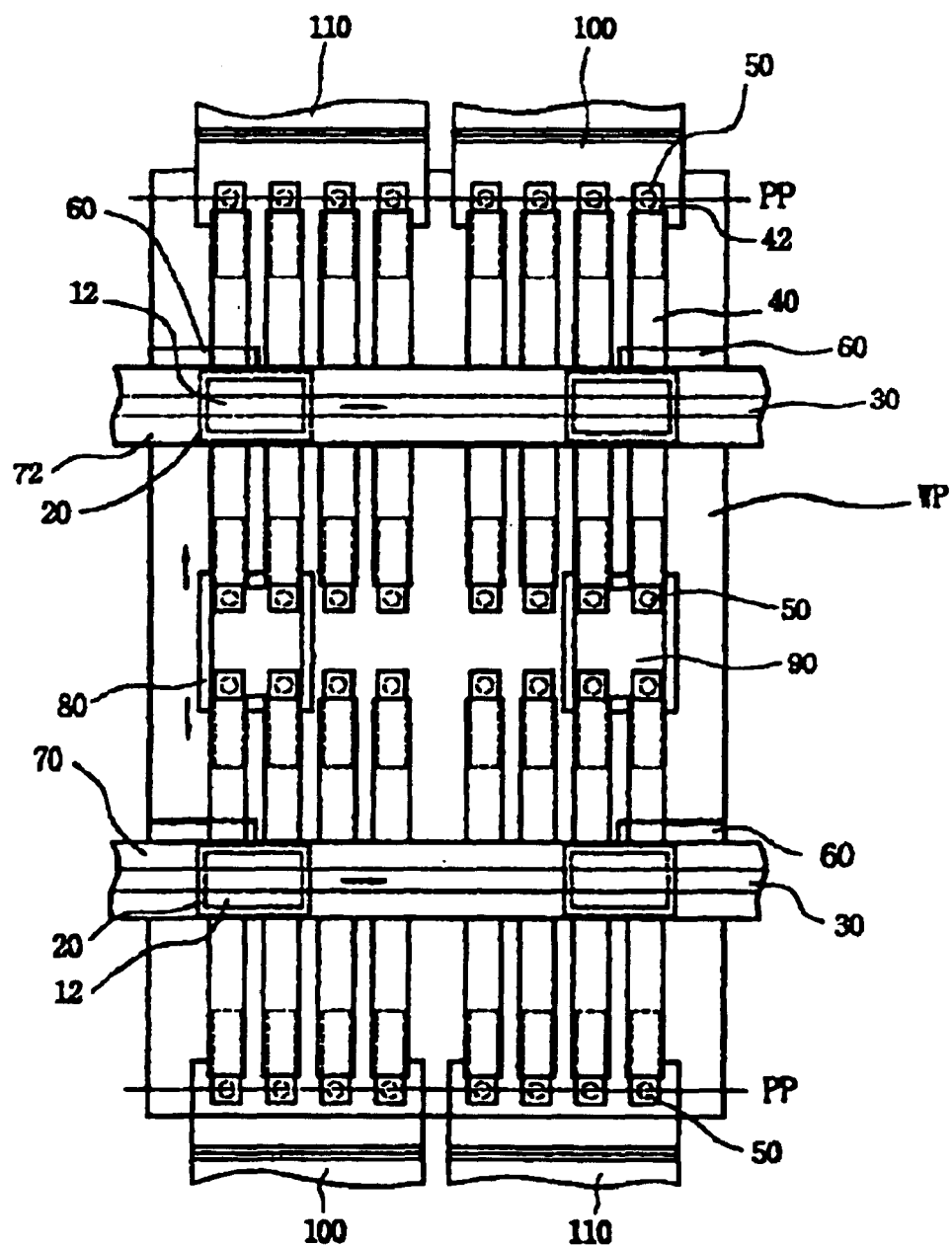
FIG. 5 shows a plan view illustrating another embodiment of the present invention.
Figure 6A:
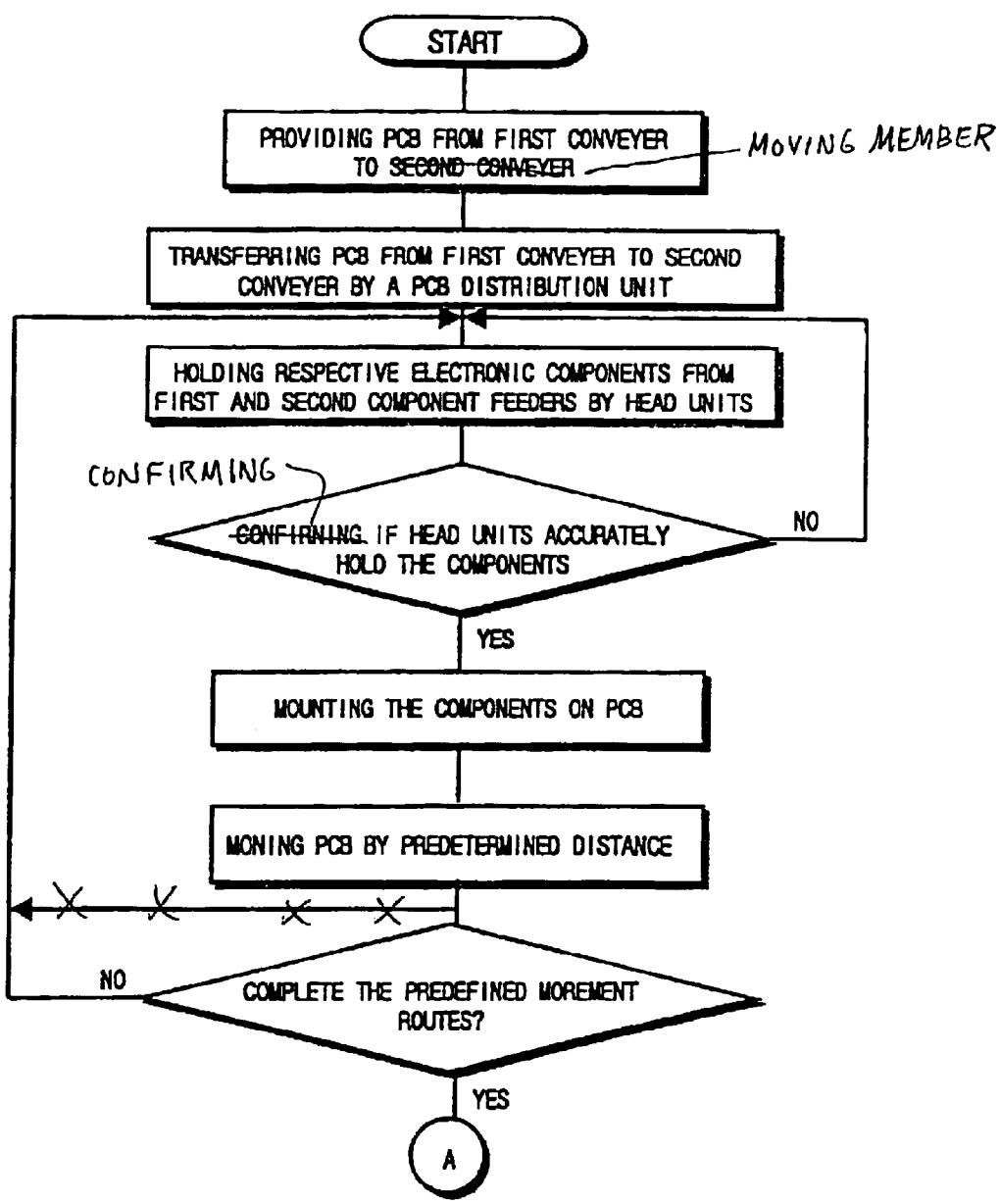
FIGS. 6a and 6b are flow-charts for explaining the surface mounting method according to the present invention.
Figure 6B:
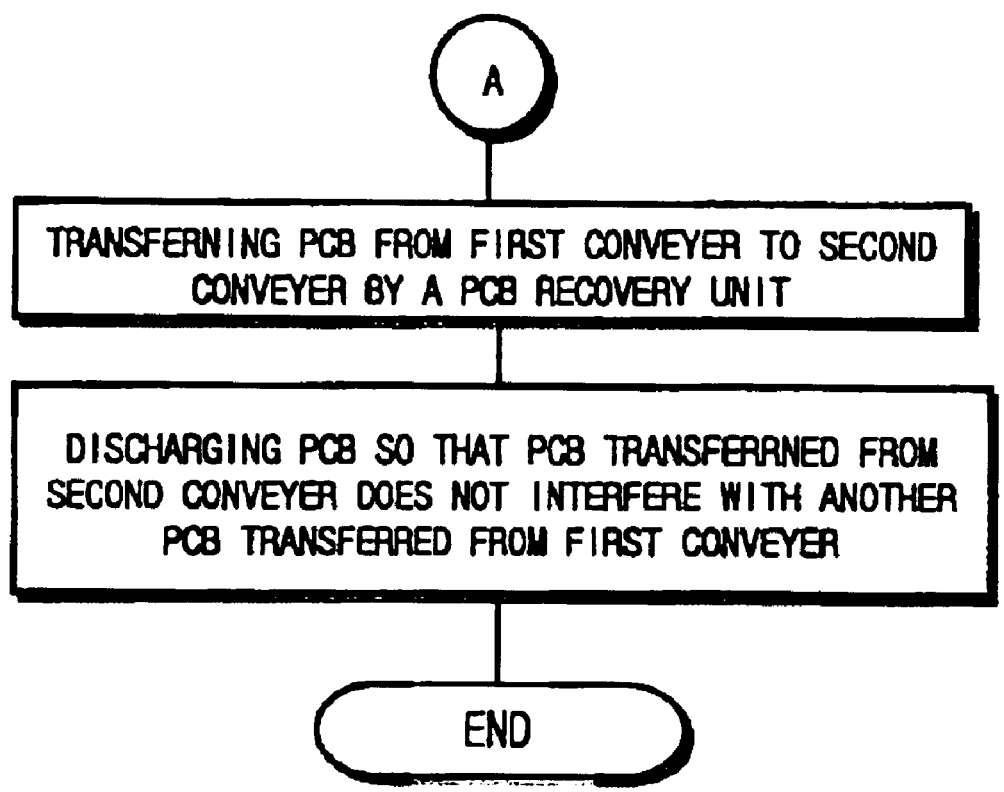

FIG. 5 shows a plan view illustrating another embodiment of the present invention, and FIGS. 6a and 6b are flow-charts for explaining the surface mounting method according to the present invention.

According to another embodiment of the surface mounting apparatus of the present invention, there are provided first and second conveyers 70, 72 within a work area WP, as shown in FIG. 5. Also, the present embodiment is structured in such a manner that the PCB 12 seated on the moving member 20 positioned on the first conveyer 70 is delivered from the first conveyer 70 to the second conveyer 72 by using a PCB distribution unit 80.

The PCB 12 delivered from the first conveyer 70 is seated on the moving member 20. Then, the head unit 50 receives the electronic components from a first component feeder 100 to mount the same on PCB. Thereafter, the head unit 50 moves by a predetermined distance for receiving the electronic component from a second component feeder 110, to mount it on PCB.

The PCB distribution unit 80 may deliver the PCB placed on the first conveyer 70 to the second conveyer 72. Namely, the head unit 50 receives the electronic components from the second component feeder 110 to mount it on PCB transferred to the second conveyer 72. Thereafter, the head unit 50 moves by a predetermined distance for receiving the electronic component from the first component feeder 100, to mount it on PCB.

The PCB 12 having mounted all required components thereon is again moved to the first conveyer 70 by a PCB recovery unit 90, and finally exits from the first conveyer 70. It is noted that any overlap between the PCBs 12 on the first and second conveyers 70, 72 may be avoided by using, for example, a buffer (not shown).

For the second embodiment according to the present invention, in case of a small amount of work, only first conveyer 70 and its associated parts may be used in response to the user's demand, whereas in case of a large amount of work, both first and second conveyers 70, 72 may be used. For example, in case of a small amount of work, after the PCB 12 fed from the first conveyer 70 is seated on the moving member 20, the head unit 50 attached at a predetermined place of the Y-frame 40 sequentially receives the electronic components from the first and second components feeders 100, 110 to mount them on the PCB 12, thereby finishing the surface mounting processes. In other words, the second conveyer 72 may be dispensable.

However, the present embodiment of the invention generally uses both first and second conveyers 70, 72 to thereby reduce the process time by individual process for the PCB 12 without the overlapping process for the PCBs 12. Thus, this results in an improvement of the throughput. Further, the PCBs 12 are continuously provided to the first conveyer 70 in a predetermined interval, and therefore a waste of extra time can be reduced.

On the other hand, the PCB distribution unit 80 and the PCB recovery unit 90 preferably maintain the same level as that of the moving member 20, and are preferable to be implemented by separate linear motor, surface motor, or the like.

According to another embodiment of the present invention, there is provided, as shown in FIGS. 6a and 6b, a method for surface mounting electronic components on a PCB, the method comprising the steps of: providing the PCB 12 from a first conveyer 70 to a moving member 20; transferring the PCB 12 from the first conveyer 70 to the second conveyer 72 using a PCB distribution unit 80; respective head units 50 holding respective electronic components from first and second component feeders 100, 110; identifying if each of the head units 50 accurately holds the electronic component; holding the electronic components again, if the electronic components are not held accurately; and mounting the electronic components on the PCB 12, if the electronic components are held accurately; moving the PCB 12 by a determined distance; confirming if a predefined movement route has been completed; moving the PCB 12 from the second conveyer 72 to the first conveyer 70 using a PCB recovery unit 90; discharging the PCB so that the PCB 12 transferred from the second conveyer 72 dose not interfere with another PCB 12 transferred from the first conveyer 70.

In case the predefined movement routes are not yet completed, said step of holding respective electronic components from the first and second component feeders 100, 110 is again performed by the head unit. Also, to prevent an occurrence of interference between the PCBs 12, a buffer (not shown) may be used which enables the apparatus to operate with predetermined time interval. This makes it possible continued works.

According to the foregoing, an advantage is provided by the surface mounting apparatus according to the present invention in that a plurality of Y-frames, each being in a strip shape, are provided to hold lots of components at a time, and after confirming them by the vision unit, the plural components are mounted on the PCB. The surface mounting of plural components at a time reduces overall operation time, thus resulting in an improvement of overall productivity. Further, there is also provided an advantage in that difference between the productivity estimated at optimal conditions and the practical productivity can be significantly reduced.

What is claimed is:

1. A method for surface mounting electrical components on a printed circuit board (PCB) with a surface mounter, comprising:
    locating a PCB at a first mounting position by moving the PCB in both the X and Y directions within a working area of the surface mounter;
    picking up a plurality of electrical components substantially simultaneously with a corresponding plurality of suction nozzles; and
    moving the plurality of suction nozzles simultaneously with respect to each other to substantially simultaneously mount the electrical components on the PCB.

2. The method of claim 1, further comprising:
    locating the PCB at a second mounting position within the working area of the surface mounter; and
    repeating the picking and moving steps.

3. The method of claim 1, wherein the moving step comprises simultaneously moving the plurality of suction nozzles with respect to each other in both the X and Y directions to mount the electrical components on the PCB.

4. The method of claim 1, further comprising:
    checking the alignment of the electrical components held by the plurality of suction nozzles; and
    selectively rotating the suction nozzles and the held electrical components based on the results of the checking step before performing the moving step.

5. The method of claim 1, wherein the locating step comprises:
    transferring the PCB from a conveyer to a moving member; and
    locating the moving member at the first mounting position.

6. The method of claim 1, further comprising transferring the PCB from a first conveyer to a second conveyer before performing the locating step.

7. The method of claim 6, further comprising transferring the PCB from the second conveyer back to the first conveyer after performing the moving step.

8. A method for surface mounting electrical components on a printed circuit board (PCB) with a surface mounter, comprising:

locating a PCB at a first mounting position within a working area of the surface mounter;

picking up a plurality of electrical components with a corresponding plurality of suction nozzles; and moving the plurality of suction nozzles with respect to the PCB and with respect to each other in at least one of an X and a Y-direction to substantially simultaneously mount the plurality of electrical components on the PCB.

9. The method of claim 8, further comprising:

locating the PCB at a second mounting position within the working area of the surface mounter; and repeating the picking and moving steps.

10. The method of claim 8, wherein the moving step comprises simultaneously moving the plurality of suction nozzles with respect to each other to mount the electrical components on the PCB.

11. The method of claim 8, wherein the moving step comprises moving the plurality of suction nozzles with respect to each other in both the X and Y directions to mount the electrical components on the PCB.

12. The method of claim 8, further comprising:

checking the alignment of the electrical components held by the plurality of suction nozzles; and selectively rotating the suction nozzles and the held electrical components based on the results of the checking step before performing the moving step.

13. The method of claim 8, further comprising transferring the PCB from a first conveyer to a second conveyer before performing the locating step.

14. The method of claim 13, further comprising transferring the PCB from the second conveyer back to the first conveyer after performing the moving step.

* * * * *